United States Patent
Savas et al.

(10) Patent No.: US 9,359,674 B2
(45) Date of Patent: *Jun. 7, 2016

(54) APPARATUS AND METHOD FOR DIELECTRIC DEPOSITION

(71) Applicant: Aixtron, Inc., Sunnyvale, CA (US)

(72) Inventors: Stephen Edward Savas, Pleasanton, CA (US); Sai Mantripragada, Fremont, CA (US); Sooyun Joh, Corvalis, OR (US); Allan B. Wiesnoski, Pleasanton, CA (US); Carl Galewski, Santa Cruz, CA (US)

(73) Assignee: Aixtron, Inc., Sunnyvale, CA (US)

( * ) Notice: Subject to any disclaimer, the term of this patent is extended or adjusted under 35 U.S.C. 154(b) by 65 days.

This patent is subject to a terminal disclaimer.

(21) Appl. No.: 14/321,233

(22) Filed: Jul. 1, 2014

(65) Prior Publication Data

US 2014/0314965 A1    Oct. 23, 2014

Related U.S. Application Data

(63) Continuation of application No. 13/347,598, filed on Jan. 10, 2012, now Pat. No. 8,765,232.

(60) Provisional application No. 61/431,390, filed on Jan. 10, 2011.

(51) Int. Cl.
*C23C 16/503* (2006.01)
*C23C 16/455* (2006.01)
(Continued)

(52) U.S. Cl.
CPC .......... *C23C 16/503* (2013.01); *C23C 16/45574* (2013.01); *C23C 16/45578* (2013.01); *C23C 16/509* (2013.01); *C23C 16/54* (2013.01); *C23C 16/545* (2013.01); *H01J 37/32036* (2013.01); *H01J 37/32532* (2013.01)

(58) Field of Classification Search
None
See application file for complete search history.

(56) References Cited

U.S. PATENT DOCUMENTS

| 4,230,515 A | 10/1980 | Zajac |
| 5,543,688 A | 8/1996 | Morita |

(Continued)

FOREIGN PATENT DOCUMENTS

| DE | 4242894 A1 | 6/1994 |
| DE | 10200410043967 | 9/2004 |

(Continued)

OTHER PUBLICATIONS

PCT/US2010/041410 International search report and written opinion dated Nov. 30, 2010.

(Continued)

*Primary Examiner* — Joseph Miller, Jr.
(74) *Attorney, Agent, or Firm* — Ascenda Law Group, PC

(57) ABSTRACT

The disclosed invention includes apparatus and methods that may be used for plasma-based deposition of thin layers of material on separate or continuous web substrates at very low temperatures with very low defect density. It achieves superior control of gas phase chemistry by controlling the sequence of introduction of gaseous components. It also has substantially independent control over the rate of chemical processes in the gas and of the amount of power and energy of ion bombardment. Such control enables high quality single and multi-layer films to be deposited cost effectively and uniformly over larger areas under very low temperature conditions.

5 Claims, 12 Drawing Sheets

(51) Int. Cl.
*C23C 16/509* (2006.01)
*C23C 16/54* (2006.01)
*H01J 37/32* (2006.01)

(56) References Cited

U.S. PATENT DOCUMENTS

| | | | |
|---|---|---|---|
| 5,609,690 | A | 3/1997 | Watanabe et al. |
| 5,686,360 | A | 11/1997 | Harvey, III et al. |
| 5,757,126 | A | 5/1998 | Harvey, III et al. |
| 5,981,899 | A | 11/1999 | Perrin et al. |
| 6,198,217 | B1 | 3/2001 | Suzuki et al. |
| 6,245,396 | B1 | 6/2001 | Nogami |
| 6,262,523 | B1 | 7/2001 | Selwyn et al. |
| 6,281,469 | B1 | 8/2001 | Perrin et al. |
| 6,353,201 | B1 | 3/2002 | Yamakoshi et al. |
| 6,359,250 | B1 | 3/2002 | Blonigan et al. |
| 6,570,325 | B2 | 5/2003 | Graff et al. |
| 6,573,652 | B1 | 6/2003 | Graff et al. |
| 6,576,202 | B1 | 6/2003 | Chiu |
| 6,579,805 | B1 | 6/2003 | Bar-Gadda |
| 6,597,111 | B2 | 7/2003 | Silvernail et al. |
| 6,660,409 | B1 | 12/2003 | Komatsu et al. |
| 6,664,137 | B2 | 12/2003 | Weaver |
| 6,720,203 | B2 | 4/2004 | Carcia et al. |
| 6,743,524 | B2 | 6/2004 | Schaepkens |
| 6,779,482 | B2 | 8/2004 | Sakai et al. |
| 6,838,387 | B1 | 1/2005 | Zajac et al. |
| 6,863,020 | B2 | 3/2005 | Mitrovic et al. |
| 6,864,629 | B2 | 3/2005 | Miyaguchi et al. |
| 6,897,607 | B2 | 5/2005 | Sugimoto et al. |
| 6,916,401 | B2 | 7/2005 | Long |
| 7,015,640 | B2 | 3/2006 | Schaepkens et al. |
| 7,090,705 | B2 | 8/2006 | Miyazaki et al. |
| 7,205,034 | B2 | 4/2007 | Kawamura et al. |
| 7,264,849 | B2 | 9/2007 | Keshner et al. |
| 7,319,295 | B2 | 1/2008 | Mashima et al. |
| 7,342,361 | B2 | 3/2008 | Ellingboe |
| 7,492,091 | B2 | 2/2009 | Kharrazi-Olsson et al. |
| 7,510,913 | B2 | 3/2009 | Moro et al. |
| 7,518,142 | B2 | 4/2009 | Hoffmann et al. |
| 7,829,147 | B2 | 11/2010 | Aitken et al. |
| 7,833,587 | B2 | 11/2010 | Mashima et al. |
| 7,886,690 | B2 | 2/2011 | Ellingboe |
| 7,951,620 | B2 | 5/2011 | Won et al. |
| 8,236,424 | B2 | 8/2012 | Schaepkens et al. |
| 8,257,799 | B2 | 9/2012 | Lee |
| 8,298,625 | B2 | 10/2012 | Stimson et al. |
| 8,343,592 | B2 | 1/2013 | Kudela et al. |
| 8,359,250 | B2 | 1/2013 | Srinivasan et al. |
| 8,404,502 | B2 | 3/2013 | Won et al. |
| 8,486,487 | B2 | 7/2013 | Fukuda et al. |
| 2001/0006093 | A1 | 7/2001 | Tabuchi et al. |
| 2001/0021422 | A1 | 9/2001 | Yamakoshi et al. |
| 2001/0042554 | A1 | 11/2001 | Tamura |
| 2001/0050059 | A1 | 12/2001 | Hongo et al. |
| 2002/0069971 | A1 | 6/2002 | Kaji et al. |
| 2002/0148561 | A1 | 10/2002 | Tetsuhiro et al. |
| 2003/0066485 | A1 | 4/2003 | Yamazaki et al. |
| 2003/0070759 | A1 | 4/2003 | Aota et al. |
| 2003/0079983 | A1 | 5/2003 | Long et al. |
| 2003/0082313 | A1 | 5/2003 | Chien |
| 2003/0113479 | A1 | 6/2003 | Fukuda et al. |
| 2004/0137647 | A1 | 7/2004 | Miyazaki et al. |
| 2005/0118533 | A1 | 6/2005 | Mirkarimi et al. |
| 2005/0217798 | A1 | 10/2005 | Sugiyama et al. |
| 2006/0096539 | A1 | 5/2006 | Kawasaki et al. |
| 2006/0177599 | A1 | 8/2006 | Madocks |
| 2006/0214270 | A1 | 9/2006 | Iwagami |
| 2007/0217119 | A1 | 9/2007 | Johnson et al. |
| 2007/0227662 | A1 | 10/2007 | Yamazawa |
| 2008/0139003 | A1 | 6/2008 | Pirzada et al. |
| 2008/0309242 | A1 | 12/2008 | Ellingboe |
| 2009/0081360 | A1 | 3/2009 | Fedorovskaya et al. |
| 2009/0117717 | A1 | 5/2009 | Tomasini et al. |
| 2010/0080933 | A1 | 4/2010 | Kudela et al. |
| 2010/0112235 | A1 | 5/2010 | Prinz et al. |
| 2010/0136331 | A1 | 6/2010 | Fahland et al. |
| 2011/0005681 | A1 | 1/2011 | Savas et al. |
| 2011/0005682 | A1 | 1/2011 | Savas et al. |
| 2011/0006040 | A1 | 1/2011 | Savas et al. |
| 2011/0262679 | A1 | 10/2011 | Azuma et al. |

FOREIGN PATENT DOCUMENTS

| | | | |
|---|---|---|---|
| JP | 2002212744 | A | 7/2002 |
| JP | 2003/093869 | | 4/2003 |
| JP | 2003093869 | | 4/2003 |
| WO | WO-2006/120239 | A1 | 11/2006 |
| WO | 2007016999 | A2 | 2/2007 |
| WO | WO2008/055993 | A1 | 5/2008 |
| WO | WO2009/121975 | A1 | 10/2009 |
| WO | WO2011/006018 | A2 | 1/2011 |

OTHER PUBLICATIONS

Babayan, S.E., et al., "Deposition of silicon dioxide films with a non-equilibrium atmospheric-pressure plasma jet", *Plasma Sources Science and Technology* 10 (2001) Sep. 12, 2001, pp. 573-578.

Loureiro, J., et al., "Non-equilibrium kinetics in $N_2$ discharges and post-discharges : a full picture by modelling and impact on the application", *Plasma Sources Science and Technology* 20 (2011) Apr. 1, 2011, 12 pgs.

Soppe, W.J., et al, "Roll to Roll Fabrication Process of Thin-Film Silicon Solar Cells on Steel Foil", *ECN Solar Energy*, 2004, 4 pgs.

Stephens, D.J. et al., "The optical properties of plasma-deposited $SiO_2$ and $Si_1 N_4$ bragg reflectors in the spectral range from 1.8 to 3.0eV", *Materials Research Society*, vol. 281, 1993, pp. 809-814.

Strobel, e., et al., "Dynamic high-rate-deposition of silicon thin film layers for photovoltaic devices", *23rd European Photovoltaic Solar Energy Conference*, Sep. 1-5, 2008, Valencia, Spain, pp. 2497-2504.

Takagi, T., et al., "Large area multi-zone type VHF-PCVD system for a-Si and µc-Si deposition", *3rd World Conference on Photovoltaic Energy Conversion*, May 11-18, 2003, Osaka, Japan, pp. 1792-1795.

Van Aken, B.B., et al., "Surface (photo)voltage monitoring in roll-to-roll deposition of thin film silicon solar cells", *24th European Photovoltaic Solar Energy Conference*, Sep. 2009, Hamburg, Germany, 4 pgs.

Zimmerman, T., et al., "Inline dynamic deposition of a SI-H and µC-SI:H thin film solar cells", *25th European Photovoltaic Solar Energy Conference and Exhibition / 5th World Conference on Photovoltaic Energy Conversion*, Sep. 2010, Valencia, Spain, 4 pgs.

English Abstract of Japanese Application JP2003093869, publication date Apr. 2, 2003.

PCT/US2010/041440 International Search Report and Written Opinion dated Nov. 30, 2010.

Y. Maemura, H. Fujiyama, T. Takagi, R. Hayashi, W. Futako, M. Kondo and A. Matsuda; "Particle formation and a-Si:H film deposition in narrow-gap RF plasma CVD". Thin Solid Films vol. 345, pp. 80-84 (1999).

Simon Selitser, Time Domain CVD, Inc. "Plasma-Enhanced Deposition (of silicon dioxide) from TEOS and Oxygen". 2002.

Tobias Roschek, Tobias Repmann, Oliver Kluth, Joachim Mueller, Bernd Rech and Heribert Wagner. "High rate deposition of microcrystalline silicon solar cells using 13.56 MHz PECVD-prerequisites and limiting factors". Mat. Res. Soc. Symp. Proc. vol. 715 (A26.5.1) 2002.

English Abstract of Japanese Application JP2002212744, publication date Jan. 17, 2001.

J. Park, Henins, H. W. Herrmann, G. S. Selwyn, and R.F. Hicks; Discharge phenomena of an atmospheric pressure radio-frequency capacitive plasma source; Journal of Applied Physics; Jan. 1, 2001; pp. 20-28; vol. 89, No. 1; American Institute of Physics; United States of America.

Lee, J.W., Mackenzie, D. Johnson, S. J. Pearton, F. Ren and J. N. Sasserath; Development of Low Temperature Silicon Nitride and Silicon Dioxide Films by Inductively-Coupled Plasma Chemical Vapor Deposition.

G. R. Nowling, S. E. Babayan, V. Jankovic and R. F. Hicks; Remote plasma-enhanced chemical vapour deposition of silicon nitride at

(56) References Cited

OTHER PUBLICATIONS atmospheric pressure; Plasma Sources Science and Technology; Feb. 4, 2002; pp. 97-103; vol. 11; Institute of Physics Publishing; United States of America.

S. Y. Moon, J. K. Rhee, D. B. Kim, and W. Choe; •,•,and normal, abnormal glow discharge modes in radio-frequency capacitively coupled discharges at atmospheric pressure; Physics of Plasmas 13, 033502 (2006); pp. 1-6; American Institute of Physics; United States of America.

J. Yota, J. Hander, and A. A. Saleh; A comparative study on inductively-coupled plasma high-density plasma, plasma-enhanced, and low pressure chemical vapor deposition silicon nitride films;; J. Vac. Sci. Technol. A vol. 18 No. 2, Mar./Apr. 2000 pp. 372-376; American Vacuum Society; United States of America.

S. A. Moshkalyov, J. A. Diniz, J. W. Swart, P. J. Tatsch, and M. Machida; Deposition of silicon nitride by low-pressure electron cyclotron resonance plasma enhanced chemical vapor deposition in N2/Ar/SiH4; J. Vac. Sci. Technol. B vol. 15 No. 6, Nov./Dec. 1997, pp. 2682-2687; American Vacuum Society, pp. 372-376; United States of America.

W. A. Lanford and M. J. Rand; The hydrogen content of plasma-deposited silicon nitride; J. Appl. Phys. 49(4), Apr. 1978, pp. 2473-2477.

D. Landheer, N. G. Skinner, T. E. Jackman, D.A. Thompson, J.G. Simmons,Andd.V. Stevanovic, and D. Khatamian; Growth and characterization of silicon nitride films produced by remote microwave plasma chemical vapor deposition; J. Vac. Sci. Technol. A 9 (5), Sep./Oct. 1991, pp. 2594-2601; American Vacuum Society; United States of America.

G. Lucovsky, P. D. Richard, D. V. Tsu, S. Y. Lin, and R. J. Markunas; Deposition of silicon dioxide and silicon nitride by remote plasma enhanced chemical vapor deposition; J. Vac. Sci. Technol. A 4 (3), May/Jun. 1986, pp. 681-687; American Vacuum Society; United States of America.

F.H.P.M. Habraken and A.E.T. Kuiper, Silicon nitride and oxynitride films; Materials Sci. and Eng., R12 (1994) 123-175.

R. Chow, W. A. Lanford, W. Ke-Ming, and R. S. Rosler; Hydrogen content of a variety of plasma-deposited silicon nitrides; J. Appl. Phys., vol. 53, No. 8, Aug. 1982, pp. 5630-5634; American Institute of Physics; United States of America.

J. Madocks, W. Seaman, M.A. George, Q. Shangguan; Plasma Enhanced Chemical Vapor Deposition (PECVD) forLarge Area Applications; Preprint publication from the 53rd Society of Vacuum Coaters Annual Technical Conference 2010.

Notice of Allowance mailed Mar. 14, 2014, for U.S. Appl. No. 13/347,598, filed Jan. 10, 2012, 6 pages.

Supplemental Amendment filed Mar. 5, 2014, for U.S. Appl. No. 13/347,598, filed Jan. 10, 2012, 8 pages.

Amendment in Response to Non-Final Office Action filed Feb. 10, 2014, for U.S. Appl. No. 13/347,598, filed Jan. 10, 2012, 10 pages.

Non-Final Office Action dated Sep. 10, 2013, for U.S. Appl. No. 13/347,598, filed Jan. 10, 2012, 20 pages.

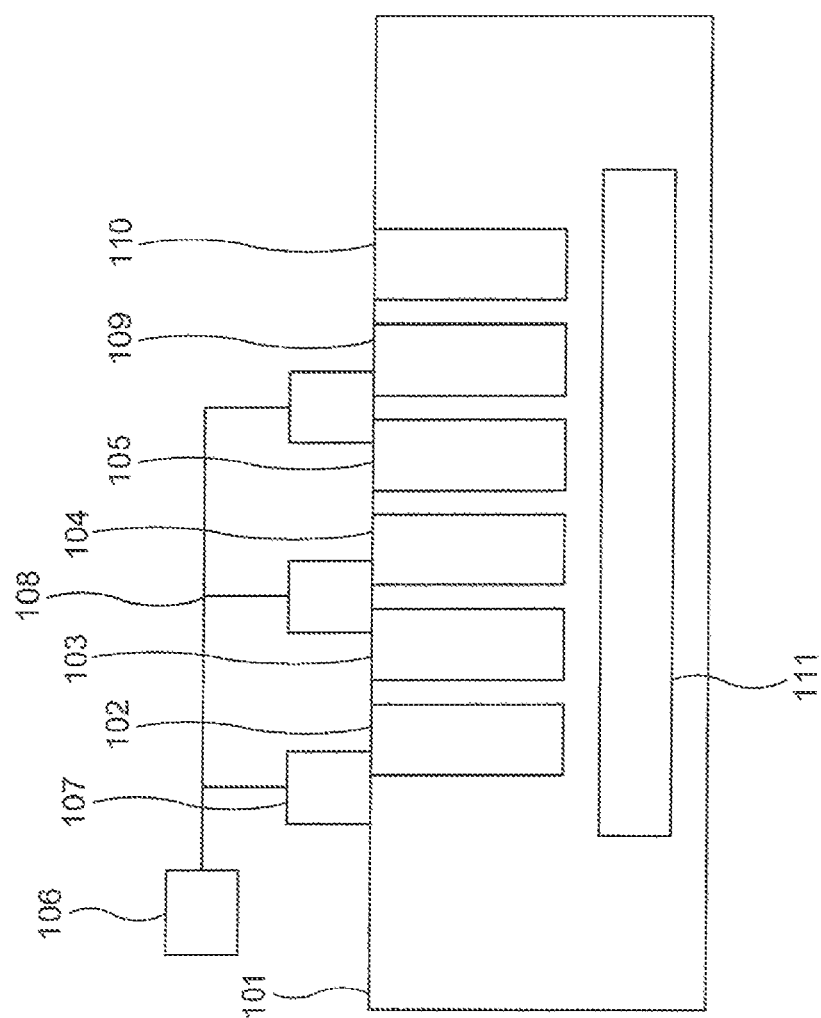

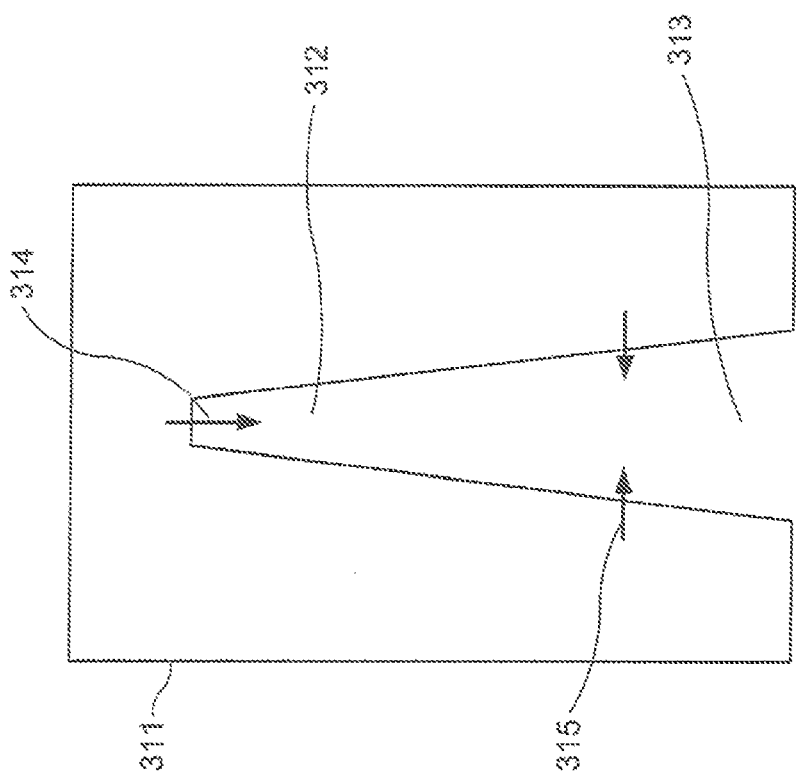

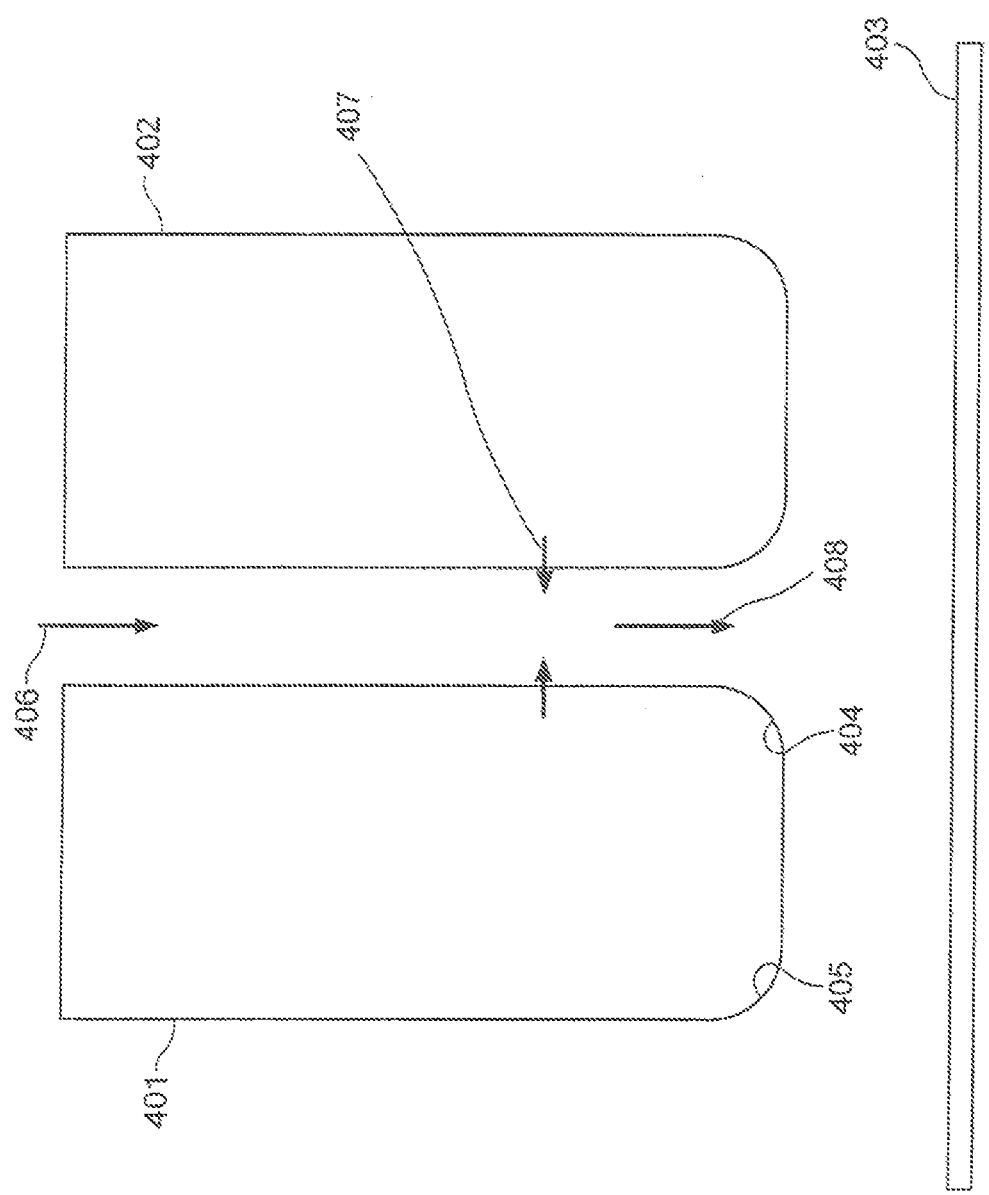

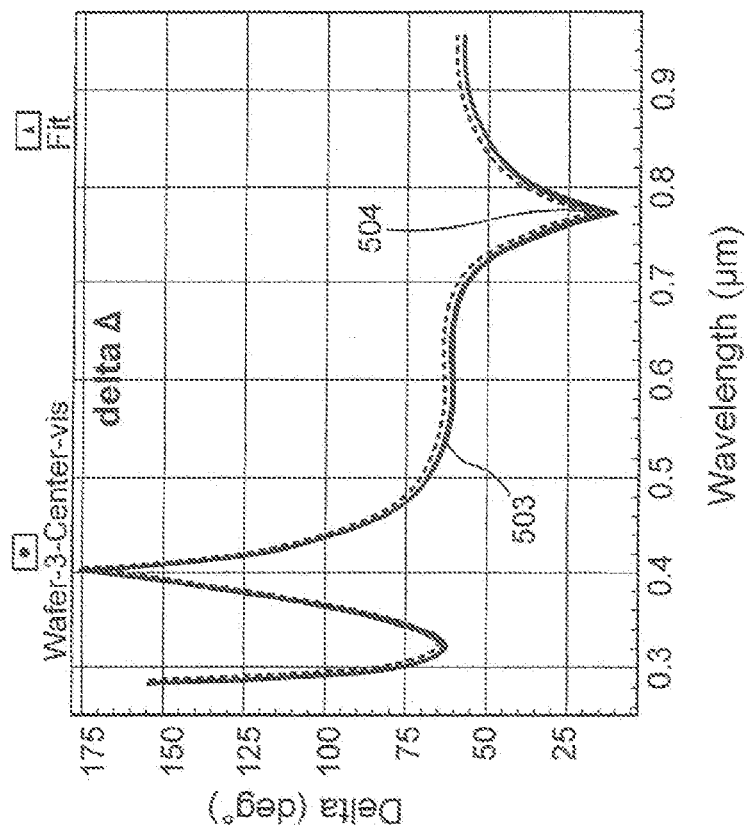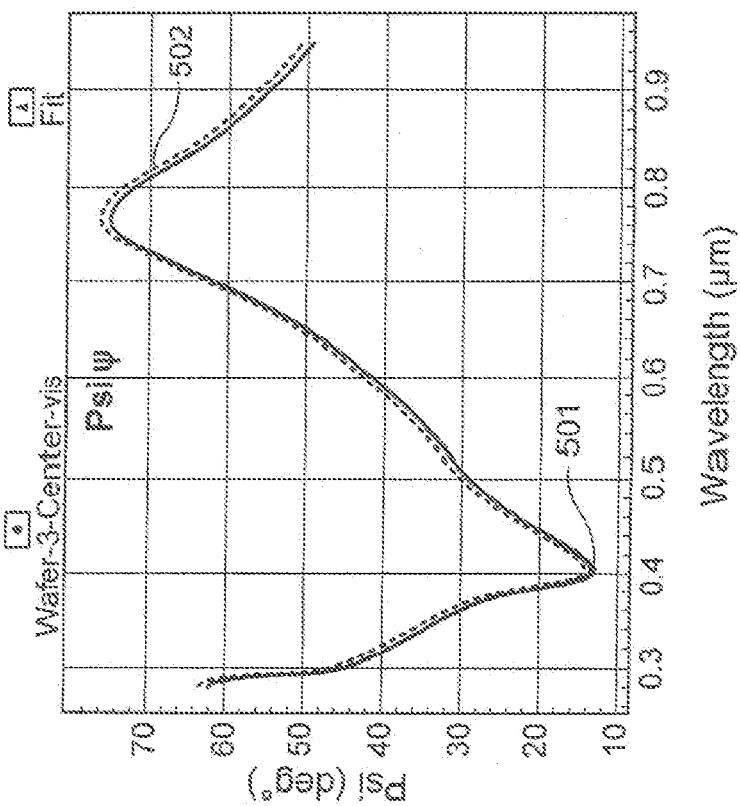
Figure 5(a)

| PGU or Process Parameter | Range of Values |
|---|---|
| Gap between electrodes near N2 injectors ; gap between electrodes and substrate ; Gap between adjacent PGU | 1 cm to 1.2 cm<br>1.2 cm to 1.5 cm<br>1.5 cm to 2 cm |
| Substrate temperature | 60 C to 70 C |
| PGU width / height, spacing from PGU to PGU | 6cm / 6cm |
| Gas Pressure | 1 Torr to 3 Torr |
| rf power density | 1 W/cm$^2$ to 2 W/cm$^2$ |
| Gas flow ranges – N2 ; O2 ; SiH4 ; Ar ; He    per meter of source length (SCCM)     nitrogen and oxygen are pre-mixed in the required proportions. | N2; 200 to 1000 ; O2; 5 to 50<br>SiH4; 20 to 50 ; Ar; 200 to 1000<br>He; 500 to 1500 |
| Cleaning gas and power density | SF6/O2 ; 1 W/cm$^2$ |

Figure 7

APPARATUS AND METHOD FOR DIELECTRIC DEPOSITION

CROSS-REFERENCE TO RELATED APPLICATION

This application is a continuation of U.S. patent application Ser. No. 13/347,598, filed Jan. 10, 2012 (now issued as U.S. Pat. No. 8,765,232), which claims priority to U.S. Provisional Application No. 61/431,390, filed Jan. 10, 2011, the contents of which are hereby incorporated herein by reference.

FIELD OF THE INVENTION

The field of the present invention relates to an apparatus and methods for plasma processing, and more particularly, to alternating current induced plasma processing for deposition of semiconductor, conductor or insulating films on carriers holding smaller substrates, rectangular substrates, or continuous band substrates.

BACKGROUND

The development of plasma enhanced processes for deposition, etching, cleaning, and surface treatments have been instrumental to maintain the progress in many manufacturing industries, such as, integrated circuits (IC), liquid crystal display screens—both LCD and OLED—and photovoltaic (PV) cells or panels.

Example reactors for plasma enhanced processing include parallel plate capacitive, sputtering and microwave discharge reactors. Scaling such reactors to process ever larger substrates typically makes it difficult to maintain desired film properties and uniformity. Further, coatings applied using such technologies have general characteristics, strengths and limitations which make them more or less suitable for different types of applications. Typically, sputtering makes coatings that have more columnar structure and less dependent on substrate temperature for proper composition of the film. RF plasma-based PECVD on the other hand tends to make denser films with more controllable stress and amorphous structure but it requires substrate temperatures above about 180 Celsius. Microwave deposition typically produces coatings at a higher rate and more efficiently from the gas feedstock but the coatings tend to be less adherent. Regarding the cleanliness of the respective technologies—RF-plasma-based PECVD has demonstrated best performance in semiconductor manufacturing of nanometer scale devices with zero defects above about 200 nm size on wafers of 300 mm diameter.

Currently, there are a growing number of opportunities for new coatings for purposes such as chemical barriers, scratch protection or optical functions on plastic substrates or on polymer layers. Some commercial applications are:

Backside insulation for thinned silicon wafers in 3D wafer level packaging. This is currently used mainly for image sensors but will be used in the next 5 years for high speed IC packaging for computing and network devices. Passivation layers for image sensors, both for concentrator lenses and for dye-based color filters. Hard coating for plastic panels used for many purposes such as unbreakable windows or scratch resistant panels for solar concentrating PV modules—including highly transparent plastics: acrylics, PMMA, PPSU, PC, and PETG.

In some important applications such coatings must be ultra-clean, which means very low defect levels—approximately one per square meter—in order to produce very large TV screens which are one of the high value products. Such substrates often cannot tolerate the minimum temperatures, typically upwards of 200 degrees Celsius, required by all PECVD reactors for ultra-clean coating processes such as depositing hard, impermeable dielectric films. While sputtering can easily provide films at substrate temperatures less than 100° C. the coatings which are applied typically are not impermeable and may be flaky due to generally tensile stress. Particle defect levels are also much higher in sputter coaters due to the difficulty of in-situ cleaning. Being able to make a high quality dielectric (hard) coating on such plastic or organic polymers is a very important industrial process enabling a number of high-potential mass market products to be manufactured at reasonable cost.

SUMMARY OF THE INVENTION

A method for the application of a coating with very thin layers of silicon oxy-nitride on large substrates used to make of thin dielectric materials or hermetic barriers for organic light emitting displays, AMOLED screens, and other electronic devices is provided. In embodiments of the inventive method, alternating current induced plasma is used for deposition of semiconductor, conductor, or insulating films on carriers holding smaller substrates, rectangular substrates, or continuous band substrates. The coating is applied to the substrates in a processing chamber with an arrangement of one or more plasma generating units (PGU) in the processing chamber. The chamber has a pedestal for support of substrates, or the substrates may be supported by a continuous web to move linearly under the PGUs or by other support to expose the substrate to the plasma for deposition or other processing. A gas for the induced plasma is exhausted by a pump through pumping ducts to manifolds on top of the processing chamber that runs the length of the sources. The two electrodes of a first processing PGU may be powered with RF or VHF power which may be at approximately the same potential. In example embodiments, the processing chamber may include one or more PGUs. The radio frequency power may be applied to the PGUs to form a plasma from source gases for processing a substrate. In example embodiments, a first gas, such as a reactant gas, may be injected at a first location in a gap between electrodes of PGUs or in a groove or recess formed in a PGU. The gas may be dissociated to form the plasma. In example embodiments, a second gas, such as a precursor gas containing silicon or metal, may be injected into the plasma downstream closer to the substrate (for example at a different location in a gap between electrodes of the PGUs or in a groove or recess formed in a PGU). The gas may flow across the surface of the substrate in the region between the PGU and the substrate.

BRIEF DESCRIPTION OF THE DRAWINGS

FIG. 1 is a cross section view of one embodiment of a process chamber utilizing multiple plasma sources, also called plasma generating units, which may have one or two electrodes each, for deposition on a substrate;

FIG. 3(a) thru 3(c)—Cross sections of alternative re-entrant electrode shapes used in a plasma generating unit;

FIG. 4—Cross section of a PGU with gas flows and rounded edges on lower part of electrodes;

FIG. 5(a)—Measured ellipsometric properties—Psi and Delta—which are amplitude and phase of reflected light from silicon dioxide deposited at substrate temperature less than 95° C.

FIG. 7—(Table I)—Process conditions for embodiments for coating flat substrates with high quality dielectric films of silicon oxide or oxynitride at very low substrate temperature.

DETAILED DESCRIPTION OF EMBODIMENTS

Figure 2A:
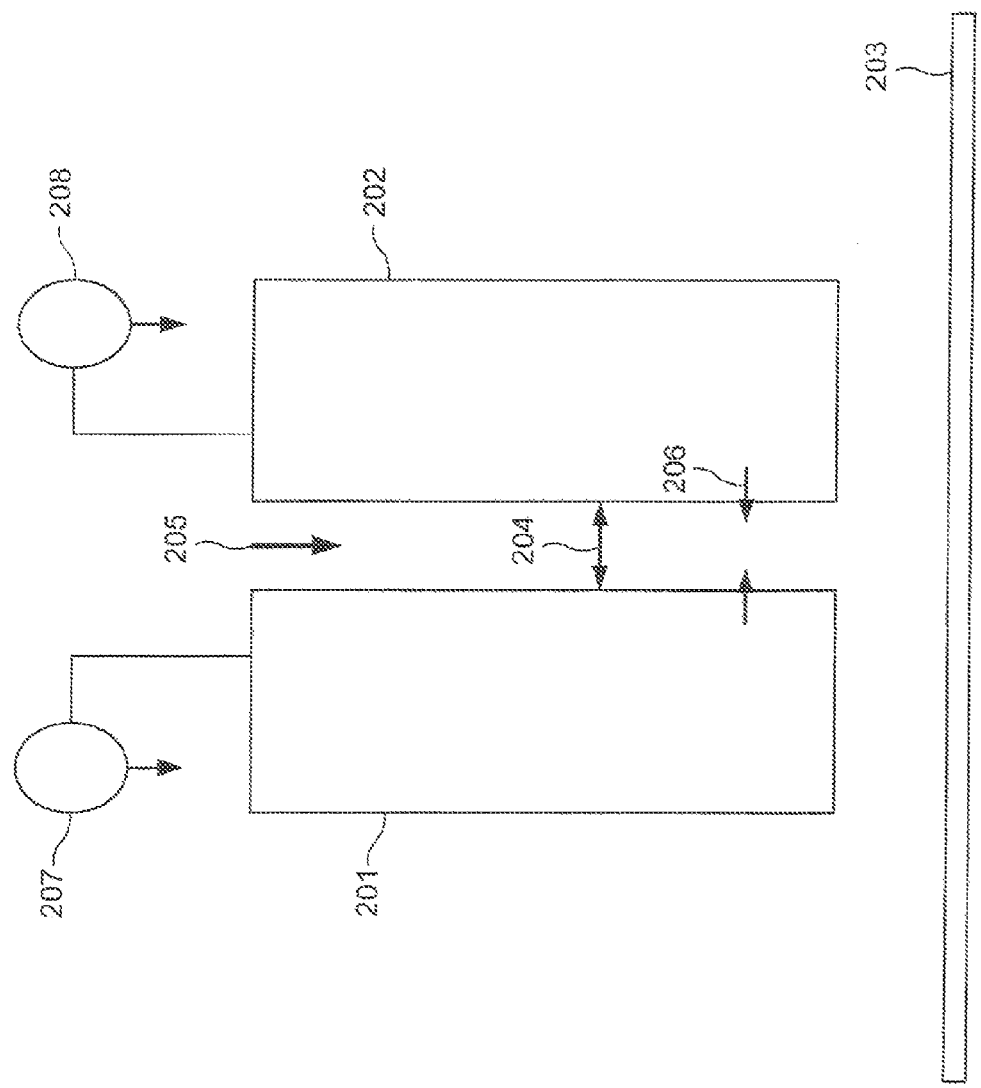
FIG. 2(a) thru 2(c)—Cross sections of embodiments of the electrode designs for simple (non-reentrant) electrode shapes, used in a plasma generating unit.

An embodiment of the disclosed invention has application for coating with very thin layers of silicon oxy-nitride on large substrates used to make AMOLED screens. Since the coating is to be applied to the substrates in this chamber the arrangement of the plasma generating unit (PGU) in the processing chamber is shown in cross section in FIG. 1. The chamber, 101, has a pedestal for support of substrates, 111. It is exhausted by pump 106 through pumping ducts, 108, to manifolds, 107, on top the processing chamber that run the length of the sources. The two electrodes of the first processing PGU, 102 and 103, may be powered with RF or VHF power which may be at approximately the same potential. In example embodiments, the processing chamber may include one or more PGUs 102 and 103. In example embodiments, the PGUs may be the example PGUs described in connection with FIGS. 2(a)-2(c) or 3(a)-(c). Radio frequency power may be applied to the PGUs to form a plasma from source gases for processing a substrate. In example embodiments, a first gas, such as a reactant gas, may be injected at a first location in a gap between electrodes of PGUs or in a groove or recess formed in a PGU. The gas may be dissociated to form a plasma. In example embodiments, a second gas, such as a precursor gas containing silicon or metal, may be injected into the plasma downstream closer to the substrate (for example at a different location in a gap between electrodes of the PGUs or in a groove or recess formed in a PGU). The substrate may be supported on pedestal 111 or may be supported by a continuous web to move linearly under the PGUs or by other support to expose the substrate to the plasma for deposition or other processing. The gas may flow across the surface of the substrate in the region between the PGU and the substrate. The example plasma reactor of FIG. 1 may be operated using the process conditions shown in FIG. 7 or otherwise described below in example embodiments to form a plasma for processing a substrate, including deposition of thin dielectric materials or hermetic barriers for organic light emitting displays or other electronic devices. Additional example processing chambers and processes that may be used in connection with example embodiments of the present invention are described in U.S. patent application Ser. Nos. 12/832,947, 12/832,953, and 12/832,934 which are incorporated herein by reference in their entirety. Such additional example processing chambers may be used in combination with one or more PGUs described in connection with FIGS. 2(a)-2(c) or 3(a)-(c) with the gaps between adjacent PGUs or PGUs and the substrate and other dimensions as described in connection with FIGS. 2(a)-2(c) or 3(a)-(c) or otherwise below. Processing methods may be carried out in such example processing chambers using the process methods and operating conditions described below and in connection with FIG. 7 and/or the processing methods and operating conditions described in the above incorporated patent applications.

There are a number of important applications that require insulating or hard coatings of very sensitive materials at very low temperatures, typically less than about 150 degrees Celsius, either for electrical insulation, physical scratch protection and/or moisture/oxygen hermetic barriers. Substrate type may be individual plates of glass or plastic, or be a long roll of material that is best processed continuously.

There are also some potential applications for thin film deposition that could open up enormous markets. One application is for coatings for OLED display screens that require very tight hermetic barriers for both oxygen and water vapor. In many cases, the underlying material cannot tolerate temperatures above about 100° C. One such sealing application is in OLED manufacture. In this market the opportunity comes from the very large market for large screen TVs. However, to make such large screens with good yield requires a low temperature coating process that has extremely low defect density—roughly one defect per square meter of substrate area.

Better films are desired for many non-critical coating applications as well as barrier applications. Desired properties of said barrier coating include that it be done at temperatures that do not damage the light emitting property of the polymer. Second, is that, in the coating, there be extremely low defects that permit moisture or gases to come through the coating to damage the sensitive material underneath. Thirdly, the coating should be uniform in thickness and composition so that it has the same required properties over the entire area of the substrate and devices that will be made from it. Fourthly, it should be scalable to larger substrates so that the cost of larger screens can be reduced. Unfortunately, it is difficult to get all of the desired properties of such insulating coatings for either type.

There is a need for a new and superior method for making such coatings at low cost in a mass production factory. Embodiments of example plasma source and process chamber designs are described below.

Embodiments of the disclosed apparatus and method produce excellent quality, dense, pinhole free insulator coatings such as silicon dioxide, silicon nitride and silicon oxynitride at substrate temperature less than 150° C., by incorporating less of the unwanted species from the plasma into the coating during growth. This results from the introduction of the reactant prior to the precursor so that the reactant is mostly dissociated or activated in the channel between electrodes or groove in the electrode prior introduction of the precursor—resulting in a very high reaction rate of the two so that the species reaching the substrate are more fully reacted than in conventional technologies. The process also helps avoid particulates by densifying the coating and desorbing undesirable species from its surface during growth which comes from the ion bombardment of the film as it is growing on the substrate. It avoids columnar structure and tensile stress of the growing film by having ion bombardment of the film, and avoiding substantial sized particles because of short residence time of the gas in the PGU by virtue of the short path length for gases flowing in the source.

This process and apparatus avoids particle formation in the reactor and defect incorporation into the growing coating by growing dense adherent (rather than flaky tensile) films on all exposed surfaces in the reactor, such that all material has good adhesion. This eliminates flakes or particulates that could be transported to the substrate to cause defects in the coating. The density and compressive stress of deposited films is due to plasma being present in all areas of the source which provides ion bombardment and compressive stress of films that grow on the electrode or PGU surfaces connected near the substrate. This method further reduces defects in the growing film by controlling gas dynamics within the reactor so that recirculation loops are avoided, thereby avoiding particle formation of sufficient size in the gas phase to cause defects in the coating. This is accomplished by avoiding sudden or large changes in the cross sectional area adjacent the electrodes within which the gas flows from its injection to its being exhausted from the chamber. This reactor permits complete and efficient plasma cleans to remove wall deposits completely, avoiding the tiny flakes and particles that often become the yield-killing defects in the coatings. Such cleaning processes are not needed as frequently as in the competing legacy technology due to the dense and compressive nature of deposited films.

The linear electrodes and constancy of the flow speed and direction for gases in the PGU for embodiments of this apparatus and method result in deposited films that are uniform in composition and thickness and this can be maintained even as the substrate size increases to G8.5 and beyond as needed for economic manufacture of large TV screens.

Embodiments of the disclosed invention use a processing chamber that is exhausted by vacuum pumps, and that contains one or more linear plasma sources, or plasma-generating units, through which a roll-to-roll web or separate substrates may be moved. Each linear plasma source is comprised of two or more electrodes or windings that are elongated, with at least a 4 to 1 ratio of length to width or height. The electrodes or windings of a source generally have their long dimensions aligned parallel. They are narrowly spaced from each other in a direction perpendicular to that long dimension and approximately parallel to the substrate movement. In some embodiments the spacing of the electrodes of a source is less than their height. The sources or PGUs are generally aligned roughly parallel with respect to other sources in the same chamber so their respective electrode or windings are approximately parallel, and along their long dimension sources are parallel to the substrate or web surface. For each source or PGU there may be one or more electrodes, depending on the electrode design.

Figure 2B:
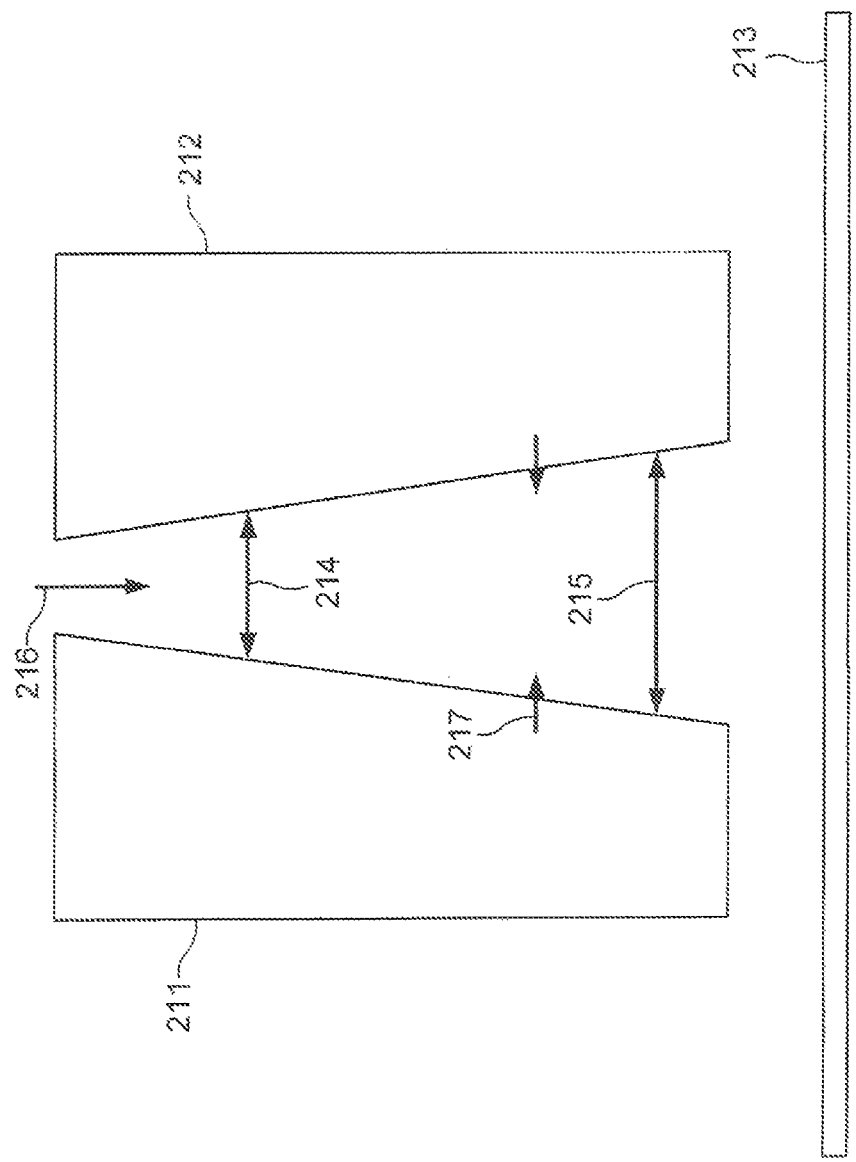
Figure 2C:
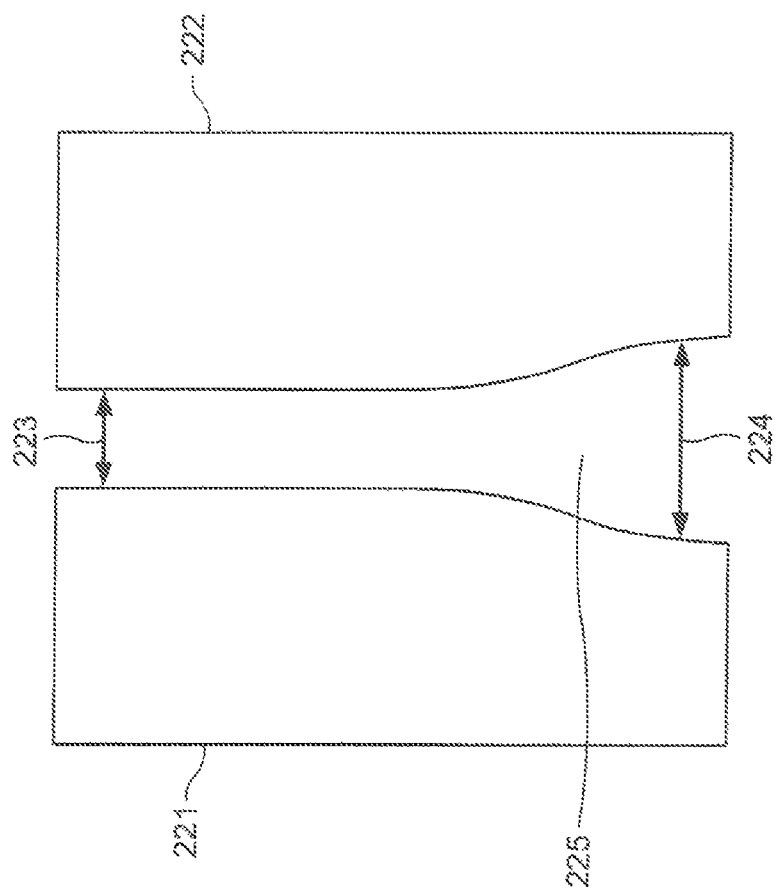

In some embodiments of the apparatus two of the types of designs for electrodes may be characterized by the shape of the electrode's cross section perpendicular to the long dimension. In one set of alternative embodiments such shape may be simple and convex, and in another it may have a deep recess between the larger parts. PGUs having only electrodes with convex shapes in some embodiments have at least two electrodes. Such electrodes of a PGU are in some embodiments separated by a gap which may vary with distance from the top of the electrodes but is constant along the length of the electrodes. Gases may be injected into this gap volume uniformly along the length of the electrodes, and in some embodiments at two or more different places along the height of said electrode. Such simple convex cross section electrodes are of two general types: (1) in some embodiments roughly rectangular with at least three straight sides and where at least three of the corners are rounded with curvature radius between about 3 millimeters and 20 millimeters. (2) in some other embodiments having at least one straight side with other sides being either rounded or for the side that faces the other electrode in that PGU, having a more complex shape with rounded steps or sloped. Please see FIG. 2(a) through 2(c) for electrode shapes in some embodiments. In 2(a) we see simple shaped electrodes, 201 and 202, having a gap between them, 204, which is roughly constant and the facing surfaces of these electrodes approximately parallel. The deposited film or coating may be applied to a substrate, 203, that is being processed. The reactant gas is injected, 205, at the end of the gap region between the electrodes furthest from the substrate. The precursor gas, which may contain silicon or metal in a gaseous form, is shown injected, 206, into the lower part of the gap closer to the substrate. The ac power supplied to the electrodes from supplies, 207 and 208, should be at approximately the same Voltage and power level, but the phases of the current in some embodiments may differ by up to 45°. It is possible that the supplies 207 and 208 may actually be a single supply with current split, and there may be a phase shifter in one or both lines to cause a phase difference between the electrodes. Note that in each figure there are two electrodes shown that are mirror images so that the volume between electrodes in some embodiments is symmetrical about a midplane parallel to their long dimension. In FIG. 2(b) we see the case where the gap between electrodes has a slope and the sides of electrodes, 211 and 212, facing each other are not parallel. In this case the gap further from the substrate, 214, is smaller than that closer to the substrate, 215, so that the ac power injected into the plasma between the electrodes will have a higher power density in the region with the narrower gap than in that with the larger gap because of the higher electrical resistance where the gap is greater. In this case, the reactant gas injected at the top, 216, is activated with higher rate than is the precursor gas injected nearer the bottom, 215. In FIG. 2(c) we see the case where the gap is smaller at the top, 223, than at the bottom, 224. In this case the facing sides of the electrodes, 221 and 222, are curved so that the gap is narrower at the top, 223, and wider at the bottom, 224. In this case, as well as 2(b) the power density in the plasma will be greater further from the substrate and will be less in the region, 225 where the gap is greater. This is the region where the reactions mainly take place between the activated reactant gas and the precursor gas.

Figure 3A:
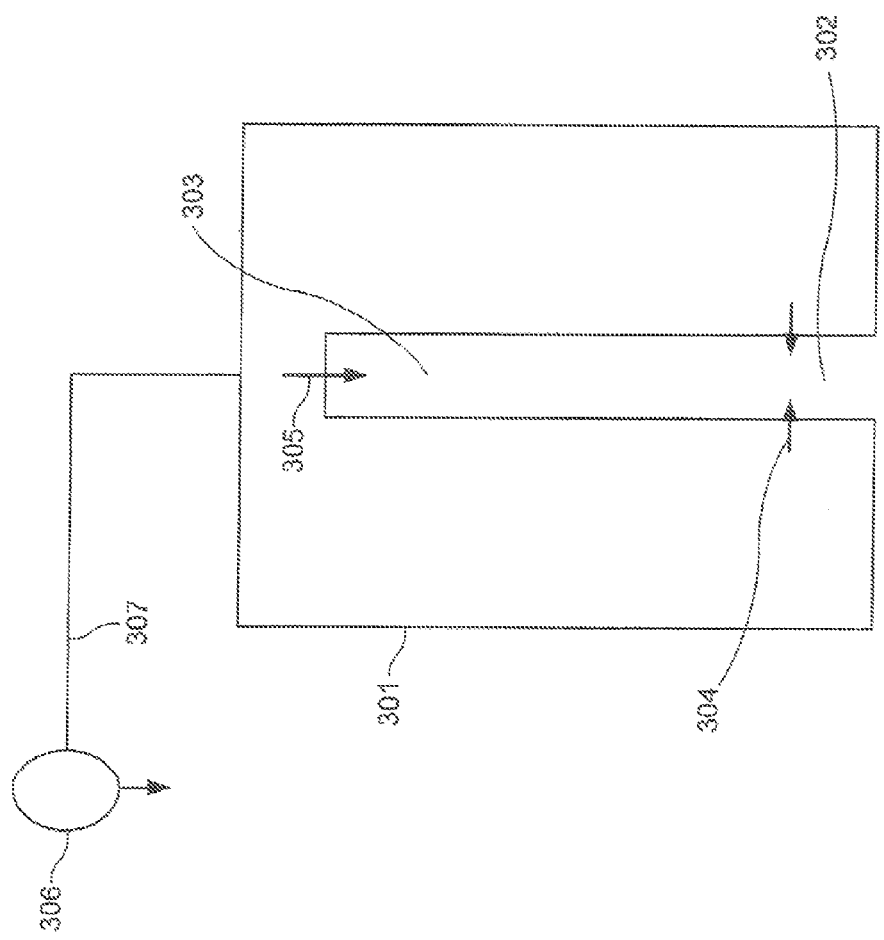
Figure 3C:
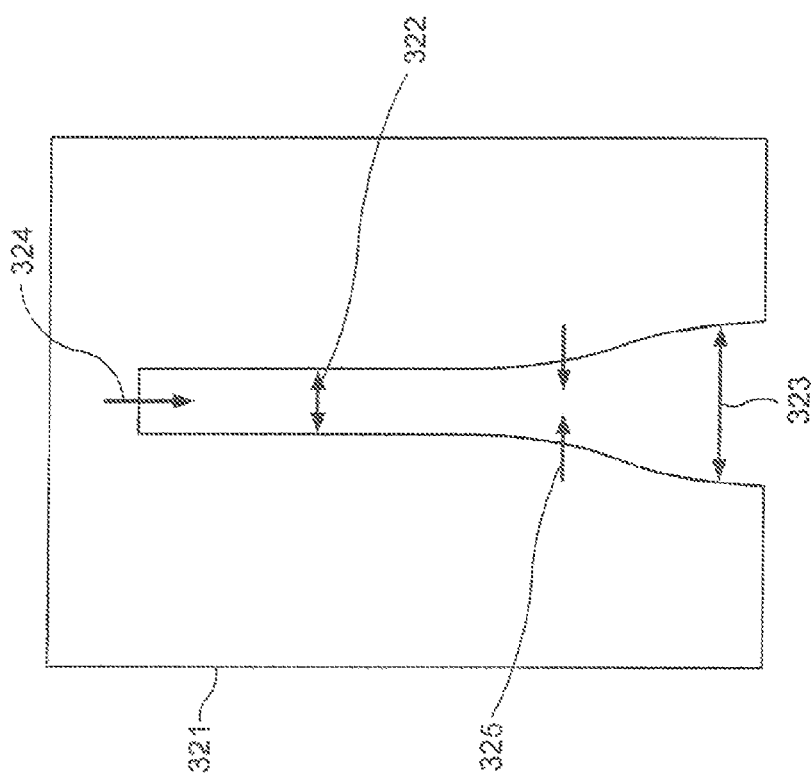

In embodiments having more complex shaped electrodes, where there may be one or more deep recesses or grooves running approximately the whole length of the electrode, a PGU may include only a single electrode. In this case, the grooves or deep recesses, which may be from about 5 millimeters to 4 centimeters wide, serve to generate plasma very much like the gap between electrodes in the case of the simple electrodes. The groove may or may not have substantially straight sidewalls. See FIG. 3(a) through 3(c) for some examples of single grooved electrode PGUs. Notable in FIG. 3(a) is that the RF power from source 306 in which is connected to the single electrode, 301, generates a hollow cathode plasma in the gap, which has uniform width, within the electrode shown as regions 302 through 303. Gases may still be injected in sequence—the reactant from the top, 305, and the precursor gas nearer the bottom, 304 of said groove. Again, the flow is downward, toward the substrate, so that the reactant is activated and then the precursor is injected into the streaming activated species where it produces the desired species for coating. The case shown in FIG. 3(b) is one where the gap is larger at the bottom so that the hollow cathode plasma generated near the top in region 312 may have a higher power density than that generated near the bottom in region 313. In this case the facing surfaces of the electrode are not parallel. Finally, in FIG. 3(c) we illustrate the situation where the deep groove in the electrode is shaped so that the groove is much narrower nearer its bottom, 322, furthest from the substrate, where the reactant is injected, 324, than it is near its top, 323, closer to the substrate. Again, in some embodiments the plasma may be denser where the gap is smaller. In some embodiments the curvature of the facing surfaces causes the flow of the gas to be without recirculation loops and without stagnation within this volume.

For PGUs where there are two or more simple electrodes, as shown in cross section in FIG. 4, the edges that are closer to the substrate, 404 and 405, may be radiused in some embodiments so that the gas flows coming down from the top of the gap, 406, and injected from the electrodes, 407, which form a combined flow, 408. Reactant gas may be injected, 406, into this volume in some embodiments as uniformly as possible along the length of this elongated volume (along the dimension not shown in this cross section figure), from the end farthest from the substrate, 403, as shown in the cross section. The gas then flows between the electrodes toward the substrate, 403, with a flow speed that in some embodiments is as uniform as possible along the length of the electrodes. In this case the flow field for the gas has very little component parallel to the long direction of the electrodes. The facing sides of electrodes may be flat and parallel as shown in FIG. 4, or may have a more complex shape as shown in FIG. 2(*b*) or 2(*c*). The bottom edges of electrodes, 404 and 405, are may be rounded with a radius of curvature of between 3 millimeters and 20 millimeters, as shown in FIG. 4.

In some embodiments different types of gases may be injected at different positions within the gap between two electrodes. Shown in FIG. 4, a first gas, 406 a reactant gas or mixture, is injected at or near one end of this volume that is furthest from the substrate. This gas flows toward the substrate within a plasma generated in the gap between the two electrodes. During flow, the gas can be activated by the plasma formed in the volume. As the gas flows toward the substrate, and at a distance of at least a centimeter from the injection point of the first gas (as shown in FIG. 4), a second gas, 407, which may be a precursor gas containing either silicon, carbon or metal, is injected. This second gas then mixes with the activated first gas and reacts as the mixture flows toward the substrate. In some embodiments the ratio of the height of the volume of plasma to the width should be more than about 2 so that the plasma density due to the "hollow cathode" effect will be substantial, and so that the chemical reactions between reactant and precursor can follow activation of the reactant gas by the plasma. These chemical reactions produce the species which deposit on the substrate to produce the coating. Because the reactions between the activated reactant species, such as oxygen atoms or nitrogen atoms, and the silicon or metal containing species are at very high rates the reactions can go to completion in a very short time while the mixture is flowing to the substrate. In some embodiments there may be gases injected at different distance from the substrate so that chemical reactions take place roughly in a sequence as desired in the flowing gas.

In some embodiments the reactions between the activated reactant and the precursor are typically exothermic and do not depend on other activation energy input from plasma to precursor. Thus, it is preferable that most plasma power should go to activation of the reactant to achieve a high concentration of activated species. To achieve this in some embodiments the plasma in the volume near reactant injection upstream of the injection of the precursor gas may have a higher electron density or electron temperature than in other regions to achieve a high level of activation of the reactant. This may be done by having a gap between the electrodes that is smaller near the point of first gas injection. In some embodiments, the gap can then increase near the point of injection of the second gas, the precursor. See FIGS. 2(*b*) and 2(*c*) and 3(*b*) and 3(*c*) for some of these gap profiles.

Once the gas flow as shown in FIG. 4 reaches the substrate, 403, coating may take place with reaction products from the gas sticking to the surface while ions from the plasma bombard it. This combination of deposition with ion bombardment causes the species at or near the surface of the film to be activated so that some undesired species are desorbed while others are given the energy to move to voids. The net effect is that the film may be made amorphous and more dense, while voids in the coating are also filled, thus avoiding pinholes.

After reaching the substrate in some embodiments the flow of the gas mixture splits into two opposite flows parallel to the substrate—one moving parallel to the substrate motion and the other moving opposite that direction. Species from the flowing gas continue to coat the substrate under the electrodes as the ions from the plasma continue to bombard the substrate surface. As the gas flows, the plasma in these regions may promote additional chemical reactions to take place and can also activate additional chemical species. In some embodiments it may be preferred that as much as possible of the precursor gas is fully reacted and becomes part of the coating. In some embodiments there is a slightly lower power density in the plasma between electrodes and substrate than between electrodes so that the level of chemical activation under the electrodes may be less, but enough ionization occurs that there is sufficient ion bombardment to achieve the desired coating properties. In some embodiments an inert gas such as argon may be injected between the electrode and substrate so that the ionization rate and ion bombardment power there are increased.

Once the flowing gas has passed between the electrodes and the substrate in some embodiments it diverts to flow away from the substrate nearest the side of the electrode opposite that side where it was injected. Here it may in some embodiments flow between the electrode of the PGU from which it originated and an electrode of an adjacent PGU within a volume defined by the height and width of the gap between these electrodes. Along the entire flow path from injection to exhaust in some embodiments there are no discontinuities or sudden increases in the cross sectional area of the channel for gas flow. This avoids stagnant or recirculating gas flow regions where large particulates can form. In some embodiments the AC voltage on the adjacent electrode of the neighboring PGU is approximately of equal amplitude. In some embodiments, the gap between the electrodes of adjacent PGUs is slightly greater than between electrodes of a PGU and therefore the power density input to the plasma in this region is only modestly less than (at least $\frac{1}{3}^{rd}$ as much) that in the rest of the plasma regions, but may be enough to sustain a plasma in this volume.

In some embodiments there is plasma sustained throughout the volume through which the gas has flowed, from injection to exhaust. Thus, the ion bombardment of the films, as they unavoidably grow on these surfaces, makes these films dense and adherent to the surface, and prevents flaking. This helps avoid the need for much more frequent in-situ cleaning, helps keep defect levels very low, and improves system productivity.

In some embodiments gas flow along the entire path within the processing chamber, from injection to exhaust, should be very nearly uniform along the length of the electrode, and have little or no component of flow velocity along the long dimension of the electrode. This helps achieve a high degree of uniformity of the process along the length of the sources and therefore over the area of a substrate. In some embodiments the disclosed processing system achieves this for two reasons. First, the exhaust manifold connects to the volume adjacent the full length of the electrode with very nearly equal flow conductance. Second, the gas pressure within the exhaust manifold may be made highly uniform along its long dimension by pumping through multiple lines of equal conductance.

In some embodiments there are a number of similar PGU, with electrodes of like shape, positioned adjacent and parallel to each other, and with spacing from adjacent PGU roughly equal that of the gap between electrodes within a PGU. This is useful since it helps increase the average deposition rate on any substrate and increase system productivity. In some embodiments there may be as many as 50 PGU adjacent one another within a chamber—with the width of a single PGU being in the range between about 5 centimeters and about 50 centimeters, depending on the length of the sources for that application and the type of coating required. Since there is also a plasma between electrodes of adjacent PGU the use of multiple PGU in series results in a continuous plasma along the length of the region in which the coating is applied. This is beneficial in improving the average rate of deposition of the coating, the cleanliness of the process and the quality of the coating itself.

For some applications such as hermetic barriers for very large OLED screens, the defect level in the barrier coating system is desired to be very low, for example, reduced to the order of one defect per square meter. This requires the maintenance of cleanliness in the deposition region of the reactor. Following are the features of example embodiments that together may reduce the defect level on the substrate by a very large factor.

The cost of multi-layer processes may be reduced with example embodiments. More than one type of film may be deposited within the same chamber at the same time by providing different gases to different groups of PGU and using a buffer gas PGU between these groups of PGU to greatly reduce the diffusion of gas from one set of PGU to another. This is possible in part because different exhaust ports are used for each PGU. One example of such a process would be deposition of alternating layers of silicon oxide (using TEOS precursor gas) and silicon nitride using silane gas. There would be one or more PGU for depositing $Si_3N_4$ and then, after a buffer gas PGU, one or more PGU for $SiO_2$, and then another one or more PGU for $Si_3N_4$ and then for $SiO_2$ and so on. Said buffer gas PGU might use argon gas or helium gas so that there would be no contamination of process gases on either side of the buffer. If there are larger numbers of layers in the coating and the layers are thicker, then multiple chambers are likely to be more practical where each may house 20 to 30 sources and the total number depends on the combined thickness of the layers and the speed with which the substrates are to be completed.

Figure 5B:
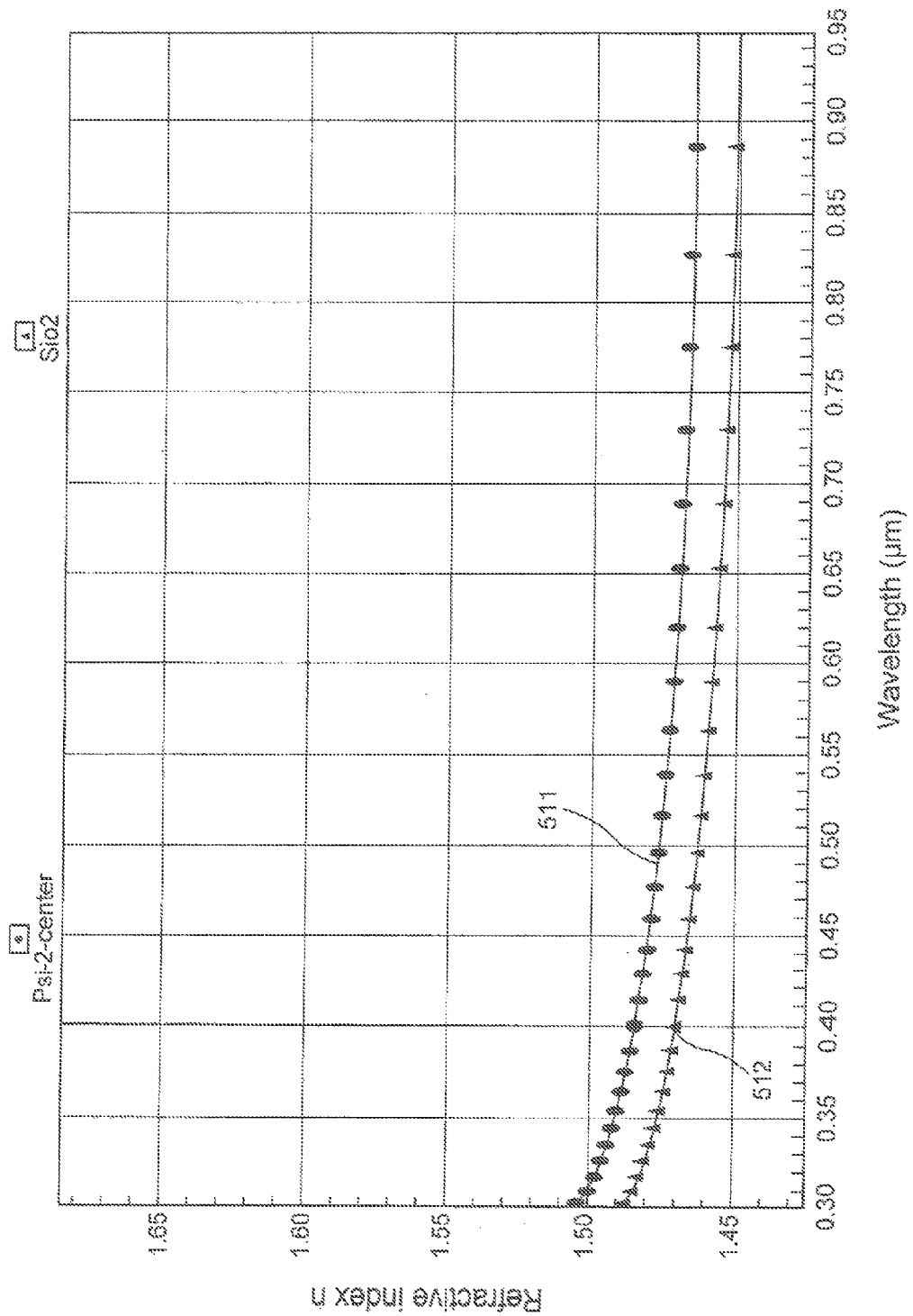
FIG. 5(b)—Calculated Refractive index for silicon dioxide deposited at 95° C. shown in comparison with that for thermally grown silicon dioxide.
Figure 6:
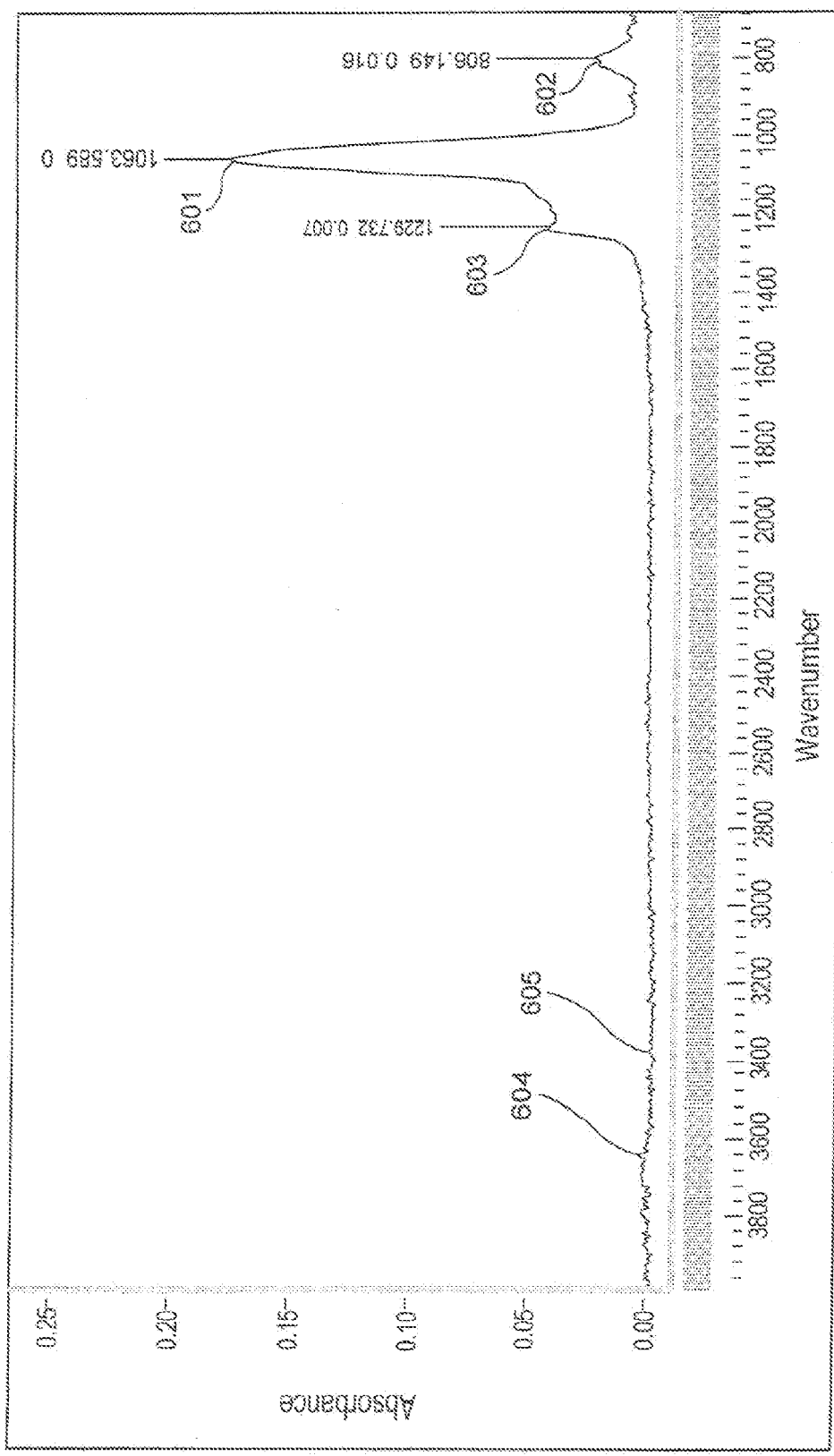
FIG. 6—Measured infrared transmission spectrum of film of silicon dioxide deposited at substrate temperature less than 95° C.

Process results for deposition of silicon dioxide have demonstrated the effectiveness of the disclosed apparatus and methods. Shown in FIG. 5 is ellipsometry data for a deposited film with substrate temperature between 90° C. and 95° C. The figure shows the Psi, 501, and Delta, 503, measured for the silicon dioxide film deposited on a silicon wafer, and the Psi, 502, and Delta, 504, modeled for thermal silicon dioxide grown on a silicon wafer with density decreased by about 1%. It is clear from the very close match of the two curves, both for Psi and for Delta that the deposited film has properties that are quite close to those of thermally grown silicon dioxide. Shown in FIG. 5(*b*) are the refractive index of the deposited film, 511, and of the reference film which is thermally grown silicon dioxide, 512. These are within about 1% across the range of wavelengths so that these films are very similar in properties, as was also shown in FIG. 5(*a*). In FIG. 6 are the results of an Fourier Transform Infrared Spectrum taken for the same deposited silicon dioxide as shown in FIG. 5, after two weeks exposure to the ambient air. This plot shows only the absorption peaks associated with desirable Si—O bonds, 601, at 1063/cm, 602, at 806/cm and virtually no trace of the absorption peaks associated with undesirable bonds such as free O—H bonds, 605, at 3400/cm, or Si—O—H, 604 at 3650/cm. Interestingly, it also shows the small shoulder peak, 603, at 1230/cm that is seen in FTIR of thermal silicon dioxide but is much less or absent in typical PECVD silicon dioxide.

In FIG. 7 is shown a Table illustrating ranges of process parameters of a process according to some example embodiments of the disclosed methods for deposition of thin layers of silicon oxide or oxynitride.

The apparatus and method described herein is applicable to a range of different substrate types, including discrete pieces of glass or plastic, or to continuous rolls of metal or plastic films. Some details of the plasma sources, which may be called plasma generating units (PGU), such as electrode shapes, and their spatial arrangement will change when processing roll substrates if substrates are supported on large rollers rather than flat pedestals or plates. However, the descriptions of the PGU herein with modest changes are applicable to either of these substrate formats.

Some example embodiments (see FIG. 1, and FIGS. 2*a* through 2*c*) are apparatus for plasma-based deposition of hermetic barriers on continuous web or separate substrates within an exhausted, sub-atmospheric pressure chamber containing at least two ac powered electrodes wherein substrates are moved substantially perpendicular to the long dimension of said electrodes. In some embodiments electrodes must be at least four times as long as their width or height and are positioned substantially parallel to each other and to a substrate support, and said electrodes have a gap between them that is between about 10 millimeters and 40 millimeters, and the gap between at least one said electrode and the substrate is in the same range. The facing surfaces of said electrodes may be shaped such that the gap between these surfaces may in some embodiments be a function of the distance from the substrate in which the gap is larger nearer the substrate and smaller further from the substrate. Further, a controllable supply of a first gas may be connected through at least one outlet to that part of the space between a pair of said powered electrodes farthest from the substrate, and a controllable supply of a second gas may be connected to a channel having at least one outlet into a region between said electrodes closer to the substrate than an outlet for the first gas. In some example embodiments of this apparatus referred to above in this paragraph, the ratio of the height of these electrodes to the gap between them is at least 2, and the distance between said electrodes is roughly constant along the length of said electrodes. In some example embodiments of this same apparatus the supply of first gas includes at least one of the gases: oxygen, nitrogen, and nitrous oxide; and the second gas supply includes vapor of a silicon-containing compound. In some example embodiments of this apparatus the supply of first gas includes at least one of the gases: oxygen, nitrogen, and nitrous oxide; and the second gas supply includes vapor of a metal-containing compound. In some example embodiments of this apparatus the edges of electrodes closest to the substrate may be rounded with radius between 3 mm and 20 mm.

In another example embodiment of this apparatus, illustrated in FIG. 1 and FIG. 3, for plasma-based deposition of hermetic barriers on continuous web or separate substrates within an exhausted, sub-atmospheric pressure chamber contains at least one RF or VHF powered electrode wherein substrates are moved substantially perpendicular to the long dimension of said electrodes. In some embodiments, the electrode may be at least four times as long as its width or height and is positioned substantially parallel to a substrate support. In some embodiments where there may be only a single electrode in a PGU, said electrode has at least one deep groove parallel to its long dimension, having a depth greater than its width, which is at between 5 mm and 40 mm, and the gap between at least one said electrode and the substrate is in the same range. A controllable supply of a first gas may be connected through at least one outlet to that part of the groove farthest from the substrate, and a controllable supply of a second gas may be connected to a channel having at least one outlet into a region of said groove closer to the substrate than an outlet for the first gas. In example embodiments of the apparatus above in this paragraph a supply of the first gas may include at least one of the gases: oxygen, nitrogen, and nitrous oxide; and the second gas supply may include vapor of at least one silicon-containing compound. In some example embodiments of the above apparatus, the supply of first gas may include at least one of the gases: oxygen, nitrogen, and nitrous oxide; and the second gas supply includes vapor of at least one metal-containing compound. In some example embodiments the edges of the groove closest to the substrate are rounded with radius between 3 mm and 20 mm. In some example embodiments of the above apparatus, the facing side surfaces of said groove are shaped such that the gap between these surfaces is a function of the distance from the substrate that is larger nearer the substrate.

Some example embodiments (illustrated in FIG. 1 and FIG. 3) are methods for chemical vapor deposition of thin coatings of materials within an evacuated chamber. In example embodiments the chamber contains one or more elongated electrodes, and substrates may be moved roughly perpendicular to the long dimension of an electrode and between said electrode and a support structure. Further, the electrode length may be at least four times its width or height, and the gap between an electrode and substrates may also be less than the electrode height, and may be between 10 mm and 40 mm in size, and the electrode may have one or more grooves running approximately the length of the electrode. The groove may divide the electrode into two or more main sections where said long aperture of said groove faces the substrate, and each said groove may be between about 0.5 centimeter and 4 centimeters wide. In some embodiments such electrode is connected to one or more AC power sources, and a first reactant gas is injected into said groove in such AC powered electrode into a first region within the groove furthest from the substrate, so this gas flows toward the substrate, and a second gas including a gas-phase precursor compound containing at least one or more of silicon, metal, or carbon is injected into a second region within the groove, downstream of the flow from first region so that it mixes with the first reactant gas, and exits the groove. After flowing between the electrode and the substrate, in some embodiments, the mixed gas flows away from the substrate past the sides of the electrode and is exhausted. In some example embodiments of this deposition method there are at least two such electrodes, each having the deep groove and independent supplies of first and second gases so that different materials may be deposited on the substrate adjacent said electrodes. In some example embodiments of this deposition process the first gas may contain oxygen, nitrogen or nitrous oxide and the second gas includes a silicon-containing vapor and a dielectric layer containing silicon is deposited on a substrate maintained at a temperature below 100° C. In some example embodiments of this process the first gas contains oxygen or nitrogen and the second gas includes a vapor containing at least one metal, and a film containing at least one metal is deposited on the substrate. In some example embodiments of this process the gas pressure is between about 1 Torr (approximately 130 Pascals) and 3 Torr (approximately 390 Pascals) and the total flow of injected gas per meter of PGU length is between about 425 standard cubic centimeters per minute (SCCM) and 3600 SCCM.

In some example embodiments of this method for plasma enhanced chemical vapor deposition, that may be illustrated in connection with FIG. 1 and FIG. 2, that deposits thin coatings of materials within an evacuated chamber containing at least one PGU having two or more elongated electrodes wherein substrates may be moved roughly perpendicular to the long dimension of an electrode and between said electrode and a support structure. In example embodiments, the electrodes may be at least four times as long as their width or height and are positioned substantially parallel to each other and to a substrate support, and said electrodes have a gap between them that is between about 10 millimeters and 40 millimeters. The gap between at least one said electrode and the substrate may be in the same range, and said electrodes may be connected to at least one ac power source, and a first reactant gas injected into plasma between said electrodes into that end of said volume furthest from the substrate. This gas is activated as it flows toward the substrate, and a second gas including a gas-phase precursor compound containing at least one or more of: silicon, metal, or carbon may be injected downstream of the first region so that it mixes with the first reactant gas, and exits the groove, and after flowing between the electrodes and the substrate, this mixed gas flows away from the substrate past the sides of the electrodes and is exhausted. In some example embodiments of this above method the volume between the two electrodes has a height that is at least twice the width. In some example embodiments of the above method the gas pressure is between about 1 Torr, approximately 130 Pascals, and 3 Torr, approximately 390 Pascals. In this method the total flow of injected gas per meter of PGU length may be between about 425 standard cubic centimeters per minute (SCCM) and 3600 SCCM. In some example embodiments of the above method a dielectric film that is a hermetic barrier may be deposited on a substrate having a temperature less than about 100° C. In some example embodiments of this method the reactant gas may include oxygen or nitrous oxide that are in some degree dissociated by the plasma between said pair of electrodes to form atomic oxygen, and the film which is grown on the substrate is an oxide. In some example embodiments of the above method at least one gas may be injected into a first PGU in a chamber that is not among the gases injected into a second PGU in this same chamber so that two different materials are deposited at the same time on substrates within said chamber.

Some example embodiments may include methods for plasma-based chemical vapor deposition coating of web or individual substrates within an evacuated chamber containing one or more elongated electrodes wherein substrates may be moved roughly perpendicular to the long dimension of at least one electrode and between said electrode and a support structure. Said electrode may have a length at least four times greater its other dimensions and may be positioned so it is approximately parallel to said substrate, and said electrode may be connected to a source of AC power, and a reactant gas may be injected into a space adjacent at least one electrode so it flows toward the substrate and is activated by the plasma that is formed adjacent said electrode, and said gas. Said gas then may flow between electrode and substrate and having passed the electrode divert to flow away from the substrate to the exhaust, past the side of said electrode opposite that side where it was injected. Plasma may be maintained within the entire volume proximate at least one said electrode through which gas flows, and there may be in some embodiments no sudden changes in the cross sectional area of the channel for gas flow from injection to exhaust, thereby avoiding recirculation flows. In some example embodiments of this method the substrate may be maintained at a temperature under 100 degrees Celsius and reactant gas may contain at least one or more of oxygen, nitrogen, or nitrous oxide and a silicon-containing dielectric film may be deposited as a hermetic barrier layer. In some example embodiments of the above method there are multiple PGUs each having at least one electrode which are adjacent and roughly parallel to each other and multiple said PGUs deposit onto the substrate at the same time. In some example embodiments of this method there are multiple PGUs having separately controllable gas feeds so that films having different composition can be deposited by subsets of said PGUs on the same substrate at the same time. In some example embodiments of the above method the gas pressure is between about 1 Torr (approximately 130 Pascals) and 3 Torr (approximately 390 Pascals). In some example embodiments of this method oxygen is a constituent of the reactant gas and a metallic oxide is deposited.

Some example embodiments include a method for plasma-based processing of substrates within an exhausted, sub-atmospheric pressure chamber containing one or more elongated electrodes wherein substrates are moved substantially perpendicular to the long dimension of said generating units and between said units and a support structure. Said electrodes may be provided ac power so that they have approximately equal amplitude of the electrical potential, and such that electrode currents and voltages have phases that do not differ by more than 45°. In said embodiments a first reactant gas or mixture may be injected into the gap between a pair of such ac powered electrodes into a first region, wherein there is a plasma so this gas flows toward the substrate, and a second gas containing silicon-based or metal-based gas-phase precursor compounds may be injected into a second region downstream of the first region so that it mixes with the first reactant gas, and said gas mixture, after diverting to flow between the electrode and the substrate, then flows past the side of each electrode opposite to that side adjacent the first and second injection regions, and is exhausted. Herein, the gas may flow through plasma along its entire path from the point of injection, continuing as it flows around the electrodes or windings until it reaches the exhausts. Gaps between the two electrodes of a PGU, and between those electrodes and the substrates may be between about 1 centimeter and about 4 centimeters. In some example embodiments of this method gas flows in a laminar manner and without expansion of the channel cross section by more than a factor of about 3 as it moves around the electrode or windings. In some example embodiments of this method the reactant gas may include oxygen or nitrous oxide that are dissociated by the plasma between said pair of electrodes to release atomic oxygen, and the film which is grown on the substrate may be an oxide. In some example embodiments of this method the reactant gas includes nitrogen or ammonia that is dissociated by the plasma between said pair of electrodes to release atomic nitrogen and such that the coating grown on the substrate is a nitride. In some example embodiments of this method a precursor gas injected downstream in the PGU may contain silane or other silicon containing vapor, and the deposited material may consist, at least in part, either amorphous silicon, silicon nitride, silicon oxynitride or silicon oxide. In some example embodiments of this method the reactant gas includes a mixture predominantly of nitrogen but including a small amount of oxygen or $N_2O$ and the second gas injected includes silane or disilane and the film grown is silicon oxynitride. In some example embodiments of this method one or more films may be deposite d upon a substrate having a surface temperature less than about 90° C. and said films include one or more of the materials: silicon nitride, silicon oxide and silicon oxynitride. In some example embodiments at least one gas may be injected into the inter-electrode gap between a pair of electrodes comprising a PGU in a chamber that is not among the gases injected into an inter-electrode gap between a pair of electrodes comprising a second PGU in this same chamber so that two different coating layers may be deposited at the same time on substrates within said chamber. In some example embodiments of the above method the two different materials deposited include a first material that is a silicon oxide and a second material that is either a silicon nitride or silicon oxynitride. In some example embodiments of the above method the gas pressure in the gap between the electrodes is between about 65 Pascals and about 2000 Pascals. In some example embodiments of this method the total flow of injected gas per meter of electrode length is between about 500 standard cubic centimeters per minute (SCCM) and 5000 SCCM. In some example embodiments of this method the total injected ac power per meter of electrode length is between about 200 Watts and about 4000 Watts.

Some example embodiments may include a method for chemical vapor deposition of thin coatings of materials within an evacuated chamber containing one or more elongated electrodes wherein substrates may be moved roughly perpendicular to the long dimension of at least one electrode and between said electrode and a support structure. Said electrode length may be at least four times its width or height, and the gap between an electrode and substrates may be less than the electrode height, and may be between 0.5 centimeter and 4 centimeters in size, and an electrode has one or more slots running approximately the length of the electrode which divides the electrode into two or more main sections where said a long aperture of said slot faces the substrate, and each said slot is between about 0.5 centimeter and 4 centimeters wide, and such electrode is connected to one or more AC power sources. A first reactant gas may be injected into a slot in such AC powered electrode into a first region within the slot, near the bottom of said slot, so this gas flows toward the substrate, and a second gas containing silicon-based or metal-based gas-phase precursor compound may be injected into a second region within the slot, downstream of the flow from first region so that it mixes with the first reactant gas, and said gas mixture, after diverting to flow between the electrode and the substrate, then may flow past a side of each part of the electrode opposite to that side adjacent the first and second injection regions, and be exhausted. In some example embodiments of this method the reactant gas includes oxygen or nitrous oxide that are dissociated by the plasma between said pair of electrodes to release atomic oxygen, and the film which is grown on the substrate is an oxide. In some example embodiments of this method the second gas injected into the second region contains silane and the deposited material consists, at least in part, of either amorphous silicon, silicon nitride, silicon oxynitride or silicon oxide. In some example embodiments of this method one or more films are deposited upon a substrate while that surface is at a temperature less than about 90° C., and said films include one or more of the materials: silicon nitride, silicon oxide and silicon oxynitride. In some example embodiments of the above method at least one gas is injected into a first region or second region in a PGU in a chamber that is not among the gases injected into a second PGU in this same chamber so that two different materials are deposited at the same time on substrates within said chamber. In some example embodiments of the above method the two different materials deposited include a first material that is a silicon oxide and a second material that is either a silicon nitride or silicon oxynitride. In some example embodiments of the above method the gas pressure in the gap between the electrodes and substrate is between about 65

Pascals and about 1500 Pascals. In some example embodiments of the above method the electrodes are covered by dielectric liners that have a gap from the electrode within that is greater than about 0.2 millimeters and less than about 2 millimeters such that a plasma is not sustained within the gap between the electrode and the liner. In some example embodiments of the above method the total flow of injected gas per meter of electrode length is between about 500 standard cubic centimeters per minute (SCCM) and 5000 SCCM. In some example embodiments of the above method the total injected ac power per meter of electrode length is between about 200 Watts and about 4000 Watts.

Some example embodiments include an apparatus for chemical vapor deposition of thin layers of dielectric materials within an evacuated chamber contains pairs of elongated electrodes or sets of windings, wherein substrates are moved in a direction substantially perpendicular to the long dimension of said electrodes or windings, and pass between them and a support structure. One or more said electrodes of a PGU, whose length may be four or more times its width or height, are connected to a supply of ac current. The long edges of the sides of such electrodes facing the substrate may be rounded with radius between about 3 millimeters and 20 millimeters, and the minimum gaps between said electrodes, and those gaps between said electrodes and the substrate may be between one centimeter and four centimeters, and a supply of a reactant gas is connected to a first manifold that is positioned between or within that same pair of electrodes or windings, and which have channels with outlets for said gas in a first volume between said electrodes or windings of a PGU. A supply of a precursor gas may be connected to a second manifold within said electrodes or windings and from which manifold are channels connecting to a second volume between said electrodes or windings, and where the outlets of such channels are closer to the substrate than the outlets for the reactant gas, and exhausts from the processing chamber connect to the volumes adjacent the sides of said electrodes or windings that are opposite those side(s) having outlets for reactant and precursor gases. In some example embodiments of the above methods the reactant gas supply connected to the first manifold includes at least one of the gases oxygen, nitrogen, or nitrous oxide. In some example embodiments of the above method the reactant gas supply connected to the first manifold may include hydrogen.

Some example embodiments include methods for ultraclean chemical vapor deposition coating of substrates within an evacuated chamber containing one or more elongated electrodes wherein substrates may be moved roughly perpendicular to the long dimension of at least one electrode and between said electrode and a support structure. Two of said electrodes, whose lengths may be at least four times greater than their other dimensions are positioned so their facing long sides are approximately parallel along their long dimension, and both are parallel to said substrates, and said electrodes are connected to a source of AC power. A reactant gas may be injected into the gap between these two electrodes so it flows toward the substrate and is activated by the plasma that is formed between said electrodes, and a precursor gas may be injected at a location closer to the substrate within said same gap between said two electrodes where it mixes and reacts with said activated reactant gas. Plasma may be maintained within the entire volume between said electrodes, and within the whole volumes between said electrodes and substrate, and the volumes between said electrodes and adjacent electrodes or surfaces, so that the process gas flows within a plasma at all times within said chamber until it is exhausted. The gas pressure within the plasma volume during processing may be less than about 2000 Pascals. In some example embodiments of the above method the reactant gas may include at least one of the gases, oxygen, nitrogen, and nitrous oxide. In some example embodiments of the above method the gas flow within the plasma is laminar and without recirculation. In some embodiments of the above method all wall material in contact with the plasma is silicon-based such as polysilicon, silicon oxide, silicon nitride, silicon oxynitride or other having content of other metals less than about 100 ppm. In some embodiments of the above method the substrate support has both inert gas supply and exhausts whose gas inlet or outlet apertures adjacent the back of the substrate have a minimum dimension no greater than about two millimeters. In some embodiments of the above method substrates are maintained at the proper distance from the electrodes by inert gas supplied and pumped from the substrate support.

The invention claimed is:

1. A method for chemical vapor deposition of coatings of materials on a substrate at a temperature less than 150° C. within an evacuated chamber containing two or more elongated electrodes, the method comprising:
   moving the substrate (i) perpendicular to a long dimension of a first electrode of said two or more elongated electrodes, (ii) parallel to a short dimension of the first electrode, and (iii) between said first electrode and a support structure in the evacuated chamber, wherein: (i) a minimum gap between a bottom surface of the first electrode and the substrate is less than a width of the first electrode, the width of the first electrode measured along the short dimension, (ii) the first electrode has one or more grooves running the long dimension of the first electrode and divides the first electrode into two or more main sections where each of said one or more grooves is between 5 millimeters and 4 centimeters wide, and (iii) the first electrode is connected to one or more alternating current (AC) power sources;
   powering the first electrode with said one or more AC power sources;
   injecting a first reactant gas into a first groove of said one or more grooves in said first electrode into a first region within the first groove furthest away from the substrate, so that the first reactant gas flows toward the substrate; and
   injecting a second gas including a gas-phase precursor compound containing at least one of silicon, metal, and carbon into a second region within the first groove, downstream of the first reactant gas flow from said first region, so that the second gas mixes with the first reactant gas to form a mixed gas with a gas pressure, and after flowing between the first electrode and the substrate, the mixed gas flows away from the substrate past a side defining the long dimension of said first electrode and is exhausted from the chamber.

2. The method of claim 1, wherein said minimum gap between the bottom surface of the first electrode and the substrate is between 10 mm and 40 mm.

3. The method of claim 1, wherein (i) the first reactant gas includes at least one compound containing one of the elements oxygen and nitrogen, (ii) the second gas includes a silicon-containing vapor, and (iii) a dielectric layer containing silicon is deposited on the substrate which is maintained at a temperature below 100° C.

4. The method of claim 1, wherein (i) the first reactant gas includes at least one compound containing oxygen or nitrogen, (ii) the second gas includes a vapor containing at least one metal, and (iii) a film containing at least one metal is deposited on the substrate.

5. The method of claim 1, wherein the gas pressure is below 3 Torr, and the total flow of injected gas per meter of electrode length is between about 425 standard cubic centimeters per minute (SCCM) and 3600 SCCM.

* * * * *